United States Patent
Seipler et al.

(10) Patent No.: US 6,263,550 B1
(45) Date of Patent: Jul. 24, 2001

(54) METHOD FOR THE PRODUCTION OF PIEZOELECTRIC ACTUATORS

(75) Inventors: Dieter Seipler; Walter Röthlingshöfer, both of Reutlingen (DE); Susumu Nishigaki, Nagoya (JP)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/380,019

(22) PCT Filed: Oct. 30, 1998

(86) PCT No.: PCT/DE98/03174

§ 371 Date: Dec. 27, 1999

§ 102(e) Date: Dec. 27, 1999

(87) PCT Pub. No.: WO99/34455

PCT Pub. Date: Jul. 8, 1999

(30) Foreign Application Priority Data

Dec. 24, 1997 (DE) .............................. 197 57 877

(51) Int. Cl.[7] .................................................. H01L 41/00
(52) U.S. Cl. ........................................ 29/25.35; 310/365
(58) Field of Search ............................... 29/25.35, 25.42; 310/334, 365

(56) References Cited

U.S. PATENT DOCUMENTS 4,523,121   6/1985   Takahashi et al. .

FOREIGN PATENT DOCUMENTS

| 37 13 697 | 11/1988 | (DE) . |
| 43 06 073 | 6/1994 | (DE) . |
| 195 00 706 | 7/1996 | (DE) . |
| 2 193 386 | 2/1988 | (GB) . |
| 62-199075 | 9/1987 | (JP) . |
| WO 97 01868 | 1/1997 | (WO) . |

Primary Examiner—Carl E. Hall
(74) Attorney, Agent, or Firm—Kenyon & Kenyon

(57) ABSTRACT

A method for a parallel manufacturing of a plurality of piezoelectric actuators and a corresponding piezoelectric actuator utilize a plurality of thin foils composed of an unfired piezoelectric ceramic material which are stacked one over another. On surface of foils, an electrode is provided for each actuator. For contacting electrodes, first and second connecting openings are provided. Electrodes have cut-outs which surround either first or second connecting openings. An electrically conductive paste is introduced into connecting openings. The stacked arrangement is fired and split up into the individual actuators. As internal electrodes, the electrodes are insulated from the surroundings.

9 Claims, 2 Drawing Sheets

METHOD FOR THE PRODUCTION OF PIEZOELECTRIC ACTUATORS

FIELD OF THE INVENTION

Background Information

The present invention relates to a piezoelectric actuator which can be particularly used for actuating a fuel injector, as well as a method for manufacturing it.

Piezoelectric actuators, particularly for actuating fuel injectors, are described in, for example, German Patent Application No. 195 00 706 or German Patent No. 43 06 073. The piezoelectric actuators are composed of a plurality of piezoelectric layers stacked one over another which are each coated with an electrode on one surface. Usual piezoelectric actuators are composed of several hundred of piezoelectric layers stacked one over another in such a manner. In this manner, a relatively great length of actuating travel is achieved. As described in greater detail, for example, in German Patent Application No. 37 13 697, the electrodes of the individual piezoelectric layers must be alternately connected to a voltage source to generate an electrical field in individual layers which is oriented in the same direction. In the process, every other electrode is connected to a first pole of a voltage source, while the intermediate electrodes are connected to a second pole of a voltage source. Conventionally, as described in greater detail, for example, in British Patent No. 2 193 386, the electrodes, which extend up to the edge of the stacked piezoelectrical layers, are usually interconnected in the edge area on the outside. In a fully automated, large-scale manufacture, however, this contacting method requires considerable outlay, and is susceptible to faults, and, in addition, has the disadvantage that the electrodes, because they extend into the edge area, are not insulated against the surroundings so that the surface area of the piezoelectric actuators must be provided with an additional insulation.

SUMMARY OF THE INVENTION

The method according to the present invention has the advantage that it can be used in a fully automated manufacture, and results in very low manufacturing expenses. The electrodes of the actuator are not contacted on the outside, but on the inside, using an electrically conductive paste which is introduced into connecting openings. Therefore, the contacting according to the present invention is almost impervious to faults and insusceptible to external mechanical damage. The piezoelectrical actuators are manufactured in parallel with each other in a highly integrated manufacturing process. A block including a plurality of piezoelectric actuators is split up into the individual actuators only at the end of the manufacture. In this manner, the manufacturing rate can be considerably increased. The same advantages ensue also for the actuator according to the present invention.

If an edge area of the actuators is left free of the electrodes, the advantage ensues that the electrodes are reliably insulated from the surroundings of the actuator. Therefore, no further measures for insulating the electrodes are required. Since, in addition, the electrodes are contacted via connecting openings inside the actuator, all live components are completely insulated toward the outside. The susceptibility to failure of the actuator is markedly reduced.

In the intermediate areas between the individual actuators, perforation holes can be formed in the foils which form the piezoelectric layers. On one hand, these perforation holes are used as degassing ducts during the subsequent firing of the stacked foils. On the other hand, the perforation holes make it easier to separate the stacked arrangement into the individual actuators. In this context, the separation can be carried out by applying an opposite poled electrical field to the electrodes of adjacent actuators in an opposite direction to the polarity. While one adjacent actuator contracts, the other adjacent actuator expands. The resulting mechanical stress causes the actuators to break apart along the separating line predefined by the perforation holes. However, the perforation holes make it also easier to separate the actuators by sawing along the perforation line predefined by the perforation holes. Another suited separating method is water-jet cutting.

The metallic electrodes can be advantageously applied using a screen-printing technique, vapor depositing, or sputtering, it being advantageous not to apply the electrodes all-over, but in a, for example, netlike pattern for reasons of material saving and better adhesion promotion to the ceramic layer lying above.

DETAILED DESCRIPTION

Figure 1:
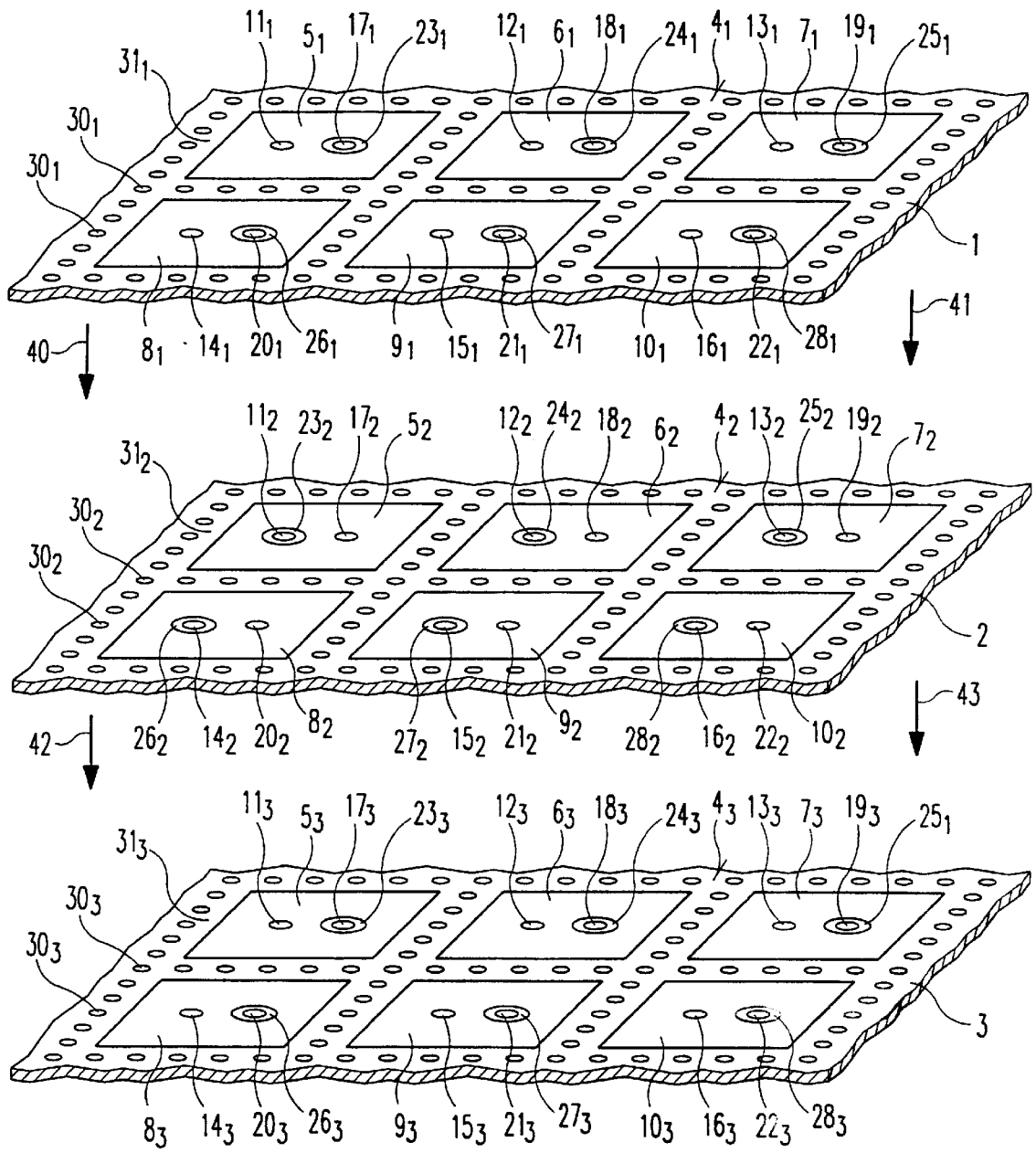
FIG. 1 shows a schematic representation of three foils composed of piezoelectric ceramic material to be stacked one over another which are coated with electrodes, and provided with connecting openings and perforation holes.

FIG. 1 shows a perspective, schematic representation to illustrate the manufacturing process according to the present invention. Shown are three foils 1, 2, and 3 made of a still unfired piezoelectric ceramic material, i.e., of "green ceramic". A suitable material is, for example, lead-barium titanate ($PbBaTiO_2$). The ceramic material can be processed into thin foils, for example, by rolling, casting, or cutting, prior to the firing. The magnitude of the foil thickness lies at, for example, 0.1 mm, without the feasibility of the present invention, being limited to this foil thickness. In a next processing step, the foils are coated with an electrically conductive material, preferably with a thin metal layer, on their upper side $4_1$, $4_2$, $4_3$. For that, all known chemical and physical surface-coating methods, for example, vapor depositing, sputtering, or a screen-printing technique, are suitable. Electrodes $5_1$ through $10_1$, $5_2$ through $10_2$, and $5_3$ through $10_3$, can be applied all-over. In a screen-printing technique, however, a netlike pattern of the electrodes is expedient. In the embodiment shown in FIG. 1, in each case, one electrode $5_1$, through $10_1$, $5_2$, through $10_2$, and $5_3$, through $10_3$, of each foil 1, 2, and 3 is assigned to an actuator, respectively. Therefore, a plurality of actuators arranged in a laterally offset manner relative to each other are processed concurrently by the method according to the present invention, allowing the manufacturing expenses to be markedly reduced. In principle, it is also possible to assign not just one, but a plurality of electrodes to each actuator if this is desirable for individual application cases.

In an operation prior or subsequent to the coating, first connecting openings $11_1$ through $16_1$ in first foil 1, $11_2$ through $16_2$ in second foil 2, and $11_3$ through $16_3$ in third foil 3, as well as second connecting openings $17_1$ through $22_1$ in first foil 1, $17_2$ through $22_2$ in second foil 2, and $17_3$ through $23_3$ in third foil 3, are formed, for example, by punching or drilling in each foil layer 1, 2, and 3, respectively. Connecting openings 11 through 22 are used for contacting individual electrodes 5 through 10, which will still be discussed in greater detail. To achieve an alternating connection between the electrodes, second connecting openings $17_1$ through $22_1$ in first foil 1 are each surrounded by a cut-out $23_1$ through $28_1$, respectively, i.e., the electrode coating does not reach up to edge of second connecting openings $17_1$ through $22_1$, but the edge of electrodes $5_1$ through $10_1$ is spaced from the edge of second connecting openings $17_1$ through $22_1$. In similar manner, electrodes $5_3$ through $10_3$ of third foil 3 are provided with cut-outs $23_3$ through $28_3$ which surround second connecting openings $17_3$ through $22_3$. In the intermediate second foil layer, however, cut-outs $23_2$ through $28_2$ of electrodes $5_2$ through $10_2$ surround first connecting openings $11_2$ through $16_2$. The same is true for a further foil which is arranged above and adjoins first foil 1, and which is not shown, and a further foil which is arranged below and adjoins third foil 3, and which is not shown. This is why cut-outs 23 through 28, from foil layer to foil layer, are alternately assigned to first connecting openings 11 through 16 or second connecting openings 17 through 22, respectively.

Furthermore, in the embodiment shown in FIG. 1, each foil layer 1, 2, and 3 is provided with perforation holes $30_1$, $30_2$, and $30_3$, respectively, which can be formed, for example, by punching or drilling concurrently with connecting openings 11 through 16 and second connecting openings 17 through 22. In the this embodiment, perforation holes 30 are formed in a netlike manner, in each case marking the boundary line between the individual actuators manufactured concurrently using the method according to the present invention.

In each foil, netlike intermediate areas $31_1$, and $31_2$, and $31_3$ are provided between electrodes $5_1$ through $10_1$ and $5_2$ through $10_2$, and $5_3$ through $10_3$, respectively, so that electrodes 5 through 10 do not reach up to the outer edge of the actuators, but are spaced from the edge marked by perforation holes 30. Perforation holes 30 are preferably arranged in intermediate areas 31 in lines running along the edges of the individual actuators. In this embodiment, actuators are manufactured which have a rectangular cross-section. To manufacture actuators having different cross-sections, the perforation holes are to be arranged in a varied manner correspondingly.

In a subsequent processing step, a plurality of foils, of which FIG. 1 only shows foils 1 through 3 in cutaway portions, are stacked one over another. To attain a sufficient length of actuator travel, preferably several hundred of the foils shown in FIG. 1 and treated as specified are stacked one over another. In the process, the individual foil layers are aligned relative to each other in such a way that both perforation holes 30, and first connecting openings 11 through 16, and second connecting openings 17 through 22 are positioned exactly one over another. This can be carried out, for example, in a fully automatic fashion using a reference-mark system capable of being mechanically or optically scanned. In FIG. 1, the stacking, that is, disposing in layers of the individual foils 1 through 3 is illustrated by arrows 40 through 43. As described above, the layer sequence of foils 1 through 3 is selected in such a manner that connecting openings 11 through 16, and 17 through 22, which are arranged one over another, respectively, are alternately surrounded by a cut-out 23 through 28 of electrodes 5 through 10 only in every other foil layer 1 through 3 so that electrodes 5 through 10 are alternately connected to first connecting openings 11 through 16 or second connecting openings 17 through 22.

In a further processing step, first connecting openings 11 through 16 and second connecting openings 17 through 22 are filled with a suitable, electrically conductive paste, for example, a metallization paste. The filling of connecting openings 11 through 16, and 17 through 22, respectively, can be carried out by drawing in with the assistance of negative pressure, or by pressing in. The electrically conductive paste is preferably introduced when the foils are already in the stacked condition. However, it is also conceivable to fill each individual foil with the electrically conductive paste prior to the stacking. Connecting openings 11 through 16, and 17 through 22 can also be designated as "via holes" so that the designation "via-fill process" is attached to the contacting method.

In a subsequent processing step, the stacked arrangement resulting from stacking foils 1 through 3 is dried under a suitable pressure at increased temperature, and, subsequently, fired at a suitable temperature. The firing temperature is preferably higher than 1,000° C., and is preferably in the range between 1,000° C. and 1,500° C.

Subsequently, the fired stacked arrangement is split up into the individual actuators. In the case of a foil size of, for example, 15×20 cm, up to 200 individual actuators can be obtained from the stacked arrangement. The separation into the individual actuators is carried out, for example, by sawing or water-jet cutting. In this context, perforation holes 30 make the separation process easier, and mark the separation point.

According to another embodiment of the present invention, the separation of the stacked arrangement into the individual actuators is carried out by applying a voltage of different polarity to adjacent actuators. Due to the electrical field which forms in the individual layers of the actuator, and which is oriented in different direction among adjacent actuators, the adjacent actuators either contract or expand, depending on the field direction. Therefore, mechanical stress arises between the adjacent actuators, which, given suitable dimensioning of the electrical field strength and the distance between the individual perforation holes 30, results in the separation of the actuators along the separation line predefined by perforation holes 30. This procedure is particularly cost-effective since no special separating device is needed.

Figure 2:
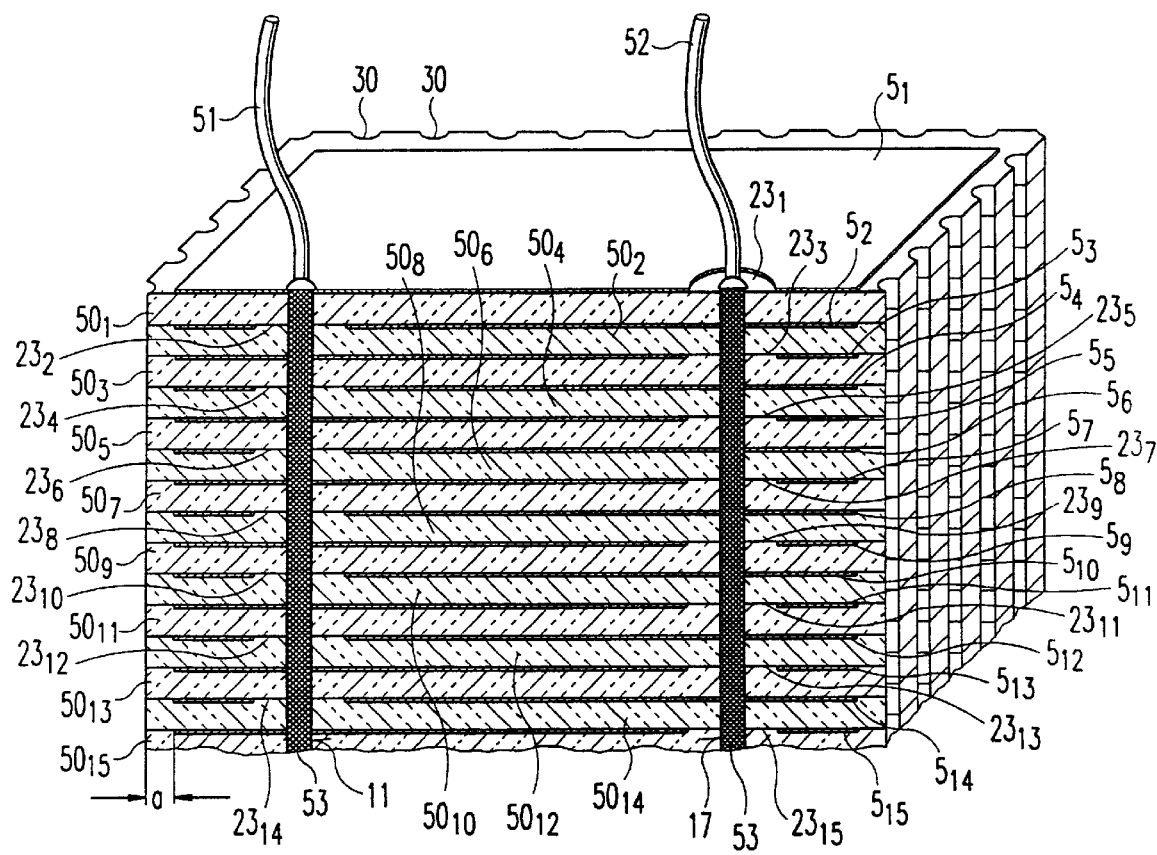
FIG. 2 shows a cut-off perspective representation of a finished actuator.

A cut-off representation of an individual actuator is shown in FIG. 2. Discernible are layers $50_1$ through $50_{15}$ made of piezoelectric ceramic material which are arranged one over another in a stack. Also discernible are electrodes $5_1$ through $5_{15}$ of individual layers $50_1$ through $50_{15}$. As elucidated in FIG. 2 again, cut-outs $23_1$ through $23_{15}$ of electrodes $5_1$ through $5_{15}$ are alternately arranged in such a way that they alternately surround first connecting opening 11 and second connecting opening 17. By electrically conductive paste $5_3$ which is filled in connecting openings 11 and 17, electrodes $5_1, 5_3, \ldots 5_{15}$ of every other layer are each connected to a first connecting wire 51 which is connected to the actuator, for example, by soldering, bonding, welding or the like. Intermediate electrodes $5_2, 5_4, \ldots 5_{14}$ are connected to a second connecting wire 52 via electrically conductive paste 53 which is introduced in second connecting openings 17. Therefore, the electrical field which, in response to the application of a voltage, forms in the actuator between connecting wires 51 and 52 is oriented in the same direction in all piezoelectric layers $50_1$ through $50_{15}$ so that the contraction or expansion of each individual piezoelectric layer $15_1$ through $15_{15}$ structurally adds up to a total length of travel of the piezoelectric actuator.

Also shown in FIG. 2 are broken-off perforation holes 30 in the edge area of the actuator. Because electrodes $5_1$ through $5_{15}$ do not extend up to the edge area of the actuator, but are spaced from the edge by a distance a, a hermetical insulation of electrodes $5_2$ through $5_{15}$ ensues. An additional insulation measure is to be provided just for topmost electrode $5_1$. Preferably, the actuator is covered at its upper side by a suitable, electrically insulating encapsulating material. This encapsulating material can be applied in a planar manner even before the stacked arrangement is separated into the individual actuators. Furthermore, it is conceivable to apply an electrically insulating covering film on the upper side as a sealing layer.

Perforation holes 30 not only make it easier to separate the stacked arrangement into individual actuators, but, as degassing ducts, particularly assist the escape of gas during the drying and firing of the stacked arrangement. Using the method according to the present invention, it is possible to manufacture piezoelectric actuators which make do with an operating voltage of less than 150 V, and generate a force of more than 1,000 N combined with a length of actuating travel of 50 μm. By water-jet cutting, the stacked arrangement can be split up into individual actuators having nearly any cross-sectional area. Thus, for example, round, triangular or star-shaped actuators are manufacturable.

What is claimed is:

1. A method for manufacturing a plurality of piezoelectric actuators in parallel, comprising the steps of:

manufacturing thin foils, each of the foils being composed of an unfired piezoelectric ceramic material;

forming at least one first connecting opening and at least one second connecting opening in each of the foils, the first and second connecting openings penetrating the foils, the first and second connecting openings of each of the foils being assigned to a respective one of the piezoelectric actuators;

coating a surface of each of the foils with a plurality of electrodes, at least one of the electrodes being assigned to the respective one of the piezoelectric actuators in each of the foils, the first and second connecting openings penetrating the foils in an area of the electrodes, each of the electrodes having a cut-out portion which surrounds one of the first connecting openings or one of the second connecting openings;

stacking the foils one over another in a particular layer sequence to form a stacked arrangement, the stacked arrangement including the first and second connecting openings arranged one over another, the particular layer sequence being selected to alternately surround particular openings of the first and second connecting openings by the cut-out portion only for every alternating one of the foils, the particular openings being arranged one over another, the electrodes being alternately connected to one of the first and second connecting openings;

providing an electrically conductive paste into the first and second connecting openings;

firing the stacked arrangement; and separating the stacked arrangement into individual ones of the piezoelectric actuators.

2. The method according to claim 1, further comprising the step of:

providing intermediate areas on the surface of each of the foils in an edge area which is provided between the individual ones of the piezoelectric actuators, the intermediate areas being left free from the electrodes.

3. The method according to claim 2, further comprising the step of:

forming perforation holes in the intermediate areas.

4. The method according to claim 3, wherein the perforation holes are arranged in particular lines which extend in the intermediate areas along edges of the individual ones of the piezoelectric actuators.

5. The method according to claim 3, further comprising the step of:

applying an oppositely poled electrical field to the electrodes of adjacent ones of the piezoelectric actuators for separating the stacked arrangement into the individual ones of the piezoelectric actuators.

6. The method according to claim 1, wherein the separation step is performed by one of a sawing procedure and a water-jet cutting procedure.

7. The method according to claim 1, further comprising the step of:

before the firing step, drying the stacked arrangement under pressure at an increased temperature.

8. The method according to claim 1, wherein the electrodes are coated using one of a first procedure and a second procedure, the first procedure being one of a screen-printing procedure, a vapor depositing procedure and a sputtering procedure, the second procedure being substantially similar to the first procedure.

9. The method according to claim 1, further comprising the step of:

during the firing step, sintering the stacked arrangement under an uniaxial pressure at a temperature of at least 1000° C.

* * * * *